(12) United States Patent
Baez (10) Patent No.: US 7,346,479 B2
(45) Date of Patent: Mar. 18, 2008

(54) SELECTING DESIGN POINTS ON PARAMETER FUNCTIONS HAVING FIRST SUM OF CONSTRAINT SET AND SECOND SUM OF OPTIMIZING SET TO IMPROVE SECOND SUM WITHIN DESIGN CONSTRAINTS

(75) Inventor: Franklin M. Baez, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 1693 days.

(21) Appl. No.: 09/148,392

(22) Filed: Sep. 4, 1998

(65) Prior Publication Data
US 2003/0208343 A1    Nov. 6, 2003

(51) Int. Cl.
G06F 7/62    (2006.01)
(52) U.S. Cl. ........................................................ 703/14
(58) Field of Classification Search .................. 703/14, 703/15, 17, 18, 19; 716/2, 6, 4, 5
See application file for complete search history.

(56) References Cited

U.S. PATENT DOCUMENTS

| | | | | |
|---|---|---|---|---|
| 5,500,805 A | * | 3/1996 | Lee et al. .................... | 364/491 |
| 5,555,201 A | * | 9/1996 | Dangelo et al. ............. | 364/489 |
| 5,612,892 A | * | 3/1997 | Almulla ....................... | 364/489 |
| 5,619,420 A | * | 4/1997 | Breid .......................... | 364/491 |
| 5,666,288 A | * | 9/1997 | Jones et al. ................. | 364/490 |
| 5,768,145 A | * | 6/1998 | Roethig ....................... | 364/488 |
| 5,774,367 A | * | 6/1998 | Reyes et al. ................ | 364/488 |
| 5,835,380 A | * | 11/1998 | Roethig ....................... | 364/488 |
| 5,838,947 A | * | 11/1998 | Sarin .......................... | 395/500 |
| 5,880,967 A | * | 3/1999 | Jyu et al. ............... | 395/500.07 |
| 5,889,685 A | * | 3/1999 | Ramachandran ....... | 395/500.27 |
| 5,910,898 A | * | 6/1999 | Johannsen ............ | 395/500.07 |
| 5,917,729 A | * | 6/1999 | Naganuma et al. .... | 395/500.09 |
| 5,926,396 A | * | 7/1999 | Ohara ......................... | 364/490 |

* cited by examiner

Primary Examiner—William Thomson
(74) Attorney, Agent, or Firm—Blakely, Sokoloff Taylor & Zafman LLP (57) ABSTRACT

In one embodiment of the invention, parameter functions for a plurality of circuits in a subsystem are created. The subsystem has design constraints. Each one of the parameter functions corresponds to each one of the circuits. The parameter functions represent a relationship among design parameters of the subsystem. The design parameters include constraint and optimizing sets. Initial design points are selected on the parameter functions having a first sum of the constraint set and a second sum of the optimizing set such that the first sum satisfies the design constraints. New design points are selected on the parameter functions such that the second sum is improved within the design constraints.

28 Claims, 9 Drawing Sheets

SELECTING DESIGN POINTS ON PARAMETER FUNCTIONS HAVING FIRST SUM OF CONSTRAINT SET AND SECOND SUM OF OPTIMIZING SET TO IMPROVE SECOND SUM WITHIN DESIGN CONSTRAINTS

BACKGROUND

1. Field of the Invention

This invention relates to computer systems. In particular, the invention relates to circuit design techniques and computer-aided design (CAD) software tools.

2. Description of Related Art

In the design of circuits of a system, the design engineer typically faces with a number of decisions based on system requirements and criteria. The system requirements and criteria usually dictate the specifications of the circuits in the system in terms of design constraints. The design constraints limit the choice of design techniques, component selection, design parameters, etc. The design engineer has to satisfy the design constraints and, at the same time, optimize the design in terms of other design parameters. This task becomes increasingly difficult as the complexity of the system increases. The design engineer has to perform complex trade-off analysis to optimize the design from a number of design parameters. Examples of the design parameters include propagation delay and the power consumption of the circuit.

Propagation delay and power consumption are two important design parameters. As microprocessor technology is becoming more advanced in speed and complexity, device power consumption increases significantly. Even with processor operating voltage reduction, device power consumption still grows at a rate of several orders of magnitude. This is largely due to an increased use of on-chip hardware to get parallelism and improve microprocessor performance. In addition, to get extra performance on certain critical timing paths, device sizes are being optimized to provide faster delays at the circuit level. However, size optimization in given design is a very time consuming process. Often, the penalty of upsizing transistors to get performance boosts comes at the expense of a much larger increase in circuit power consumption.

When a system or a functional block consists of many circuits, it is difficult to optimize the design while still meeting the design constraints. Currently, there is no known technique to allow the design engineer to optimize the overall design in a systematic and efficient manner. The design engineer usually works on each circuit separately and performs incremental optimization. This process is tedious and does not give the design engineer a global picture of the entire design.

Therefore there is a need in the technology to provide a simple and efficient method to optimize the design.

SUMMARY

The present invention is a method and computer program product for determining optimal values of design parameters of a subsystem to meet design constraints. The subsystem comprises a plurality of circuits. Parameter functions are created for the corresponding circuits. The parameter functions represent a relationship among the design parameters. The design parameters are optimized based on the parameter functions to satisfy the design constraints.

BRIEF DESCRIPTION OF THE DRAWINGS

The features and advantages of the present invention will become apparent from the following detailed description of the present invention in which.

DESCRIPTION

The present invention is a method and computer program product for determining the optimal values of the design parameters of a circuit block. Parameter functions relating the design parameters for circuits in the circuit block are created. Based on these parameter functions, the design parameters are optimized to satisfy the design constraints. In one embodiment, the design parameters include power and delay and the parameter functions are power-delay curves. The power-delay curves are generated using a timing simulator, a power estimator, and transistor sizing tools. The invention provides a technique to help designer to perform trade-off analysis for optimizing the design while meeting the design constraints.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention.

In a circuit design, the design engineer typically faces with a number of design parameters and design constraints. The design constraints are usually dictated by the system requirements and specifications. Examples of the design constraints include propagation delay, power consumption, packaging, number of input/output (I/O) lines, etc. The design constraints are typically imposed on one or more design parameters, while leaving other parameters to be optimized to achieve high performance. The design parameters, therefore, are divided into two parameter sets: a constraint set and an optimizing set. The "constraint set" includes constraint parameters which are the parameters that have to meet the design constraints. The "optimizing set" includes the optimizing parameters which are the parameters that need to be optimized. In an exemplary scenario, a constraint parameter is the propagation delay and an optimizing parameter is the power consumption. In another scenario, the propagation delay is the optimizing parameter and the power consumption is the constraint parameter.

The relationship between the constraint parameters and the optimizing parameters is described by a parameter function. A "parameter function" describes the variation of one parameter as a function of another parameter. For example, a parameter function may describe the variation of the power consumption as a function of the delay. The variation of one parameter as a function of another is typically caused by a configuration of the circuit such as the size of the transistors, the choice of circuit technology (e.g., domino versus static), etc. A configuration of the circuit that gives rise to the particular values of the design parameters corresponds to a design point.

A system, a subsystem, a module or a functional block may consist of a number of circuits. Each circuit is characterized by a parameter function. Optimizing the design of a subsystem or functional block involves a trade-off consideration of all the parameter functions of all the individual circuits of the subsystem or functional block. For a parameter function of a given circuit, there are many design points corresponding to different circuit configurations. Therefore, optimizing a subsystem or functional block involves the selection of the design points on the parameter functions that provide the optimal values of the optimizing parameters and acceptable values of the constraint parameters. The present invention provides a technique to optimize the overall design using the parameter functions.

Figure 1A:
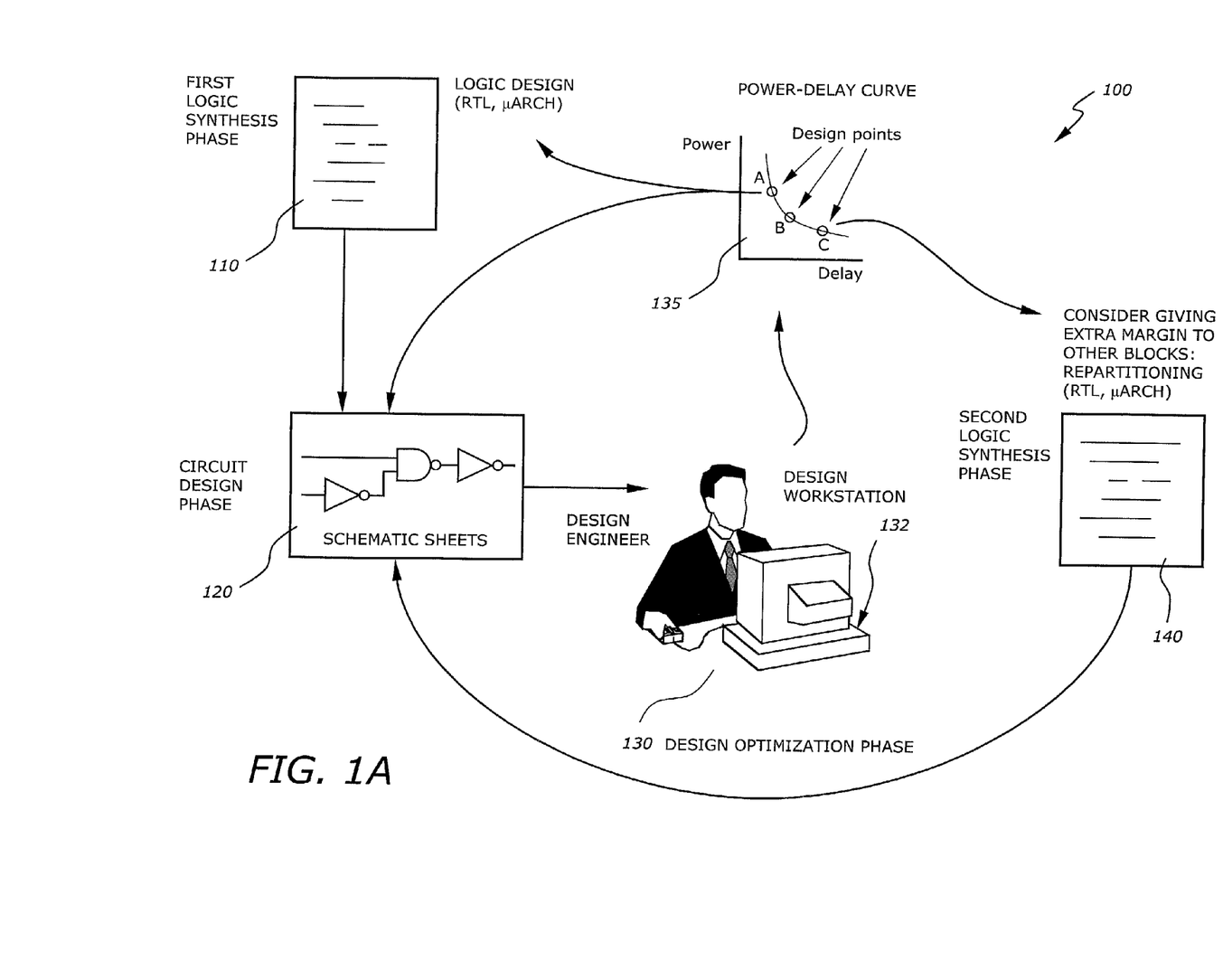
FIG. 1A is a diagram illustrating an engineering design cycle in accordance with the teachings of the invention.

FIG. 1A is a diagram illustrating an engineering design cycle in accordance with the teachings of the invention. The engineering design cycle 100 includes a first logic synthesis phase 110, a circuit design phase 120, a design optimization phase 130, and a second logic synthesis phase 140.

The first logic synthesis phase 110 provides the high level logic description and/or design of the circuits. In the first logic synthesis phase 110, the designer synthesizes the circuits manually or using a number of tools including Computer-Aided Design (CAD) tools. Examples of CAD tools include hardware description language (HDL) compilers, and schematic entry tool. The result of the first logic synthesis phase 110 includes the design in high level form such as a textual description of circuit at the behavioral level, register transfer language (RTL), or microarchitecture.

The circuit design phase 120 receives the generated logic synthesis files to generate the synthesized circuits. The synthesized circuits may be represented by circuit schematics, a netlist of the circuits, or any other convenient form that can be further processed by additional CAD tools. Essentially, the circuit design phase 120 represents an unoptimized complete design that shows subsystems or functional blocks at the detailed implementation level.

The design optimization phase 130 determines the optimal values for the design parameters to meet the design constraints. In the design optimization phase 130, the design engineer uses a design workstation or a computer system 132. The computer system 132 is supported by a design environment which includes the operating system and many CAD tools such as timing analyzer, power estimator, transistor sizing tool to adjust the design parameters according to the allowable design budgets. The design optimization phase 130 typically produces a number of parameter functions that relate the design parameters for the circuits. An example of such a parameter function is a power-delay curve 135. The power-delay curve 135 shows the relationship between the power consumption and the propagation delay for a particular circuit in a functional block. The power-delay curve 135 has a number of design points corresponding to different implementations or configurations of the circuit under consideration. The power-delay curve 135 provides the design engineer the basic information to optimize his or her circuit under the specified design constraints.

As shown in FIG. 1A, from the information provided by the power-delay curve 135, the design engineer modifies the circuit design according to the design points. The exemplary power-delay curve 135 has three design points A, B, and C. The design point A corresponds to a circuit implementation that has high power consumption and fast speed, representing an undesirable implementation because of excessive power consumption. The design point B corresponds to the optimal power consumption and optimal speed, also representing the best circuit implementation. The design point C corresponds to low power consumption and acceptable speed, representing a desirable implementation. If the circuit implementation is at the design point A, the design engineer will have the option to go back to the first logic synthesis phase 110 or the circuit design phase 120. If the circuit implementation is at the design point C, the design engineer will go to the second logic synthesis phase 140.

The second logic synthesis phase 140 is essentially the same as the first logic synthesis phase 110 with the exception that the design engineer now focuses more on giving the extra design margin to other circuits in the subsystem or functional block. The low power consumption at the design point C provides more margin to the power budget for other circuits. In the second logic synthesis phase 140, the design engineer modifies the circuit synthesis based on the extra margin, such as repartitioning, floor-plan editing, etc.

Figure 1B:
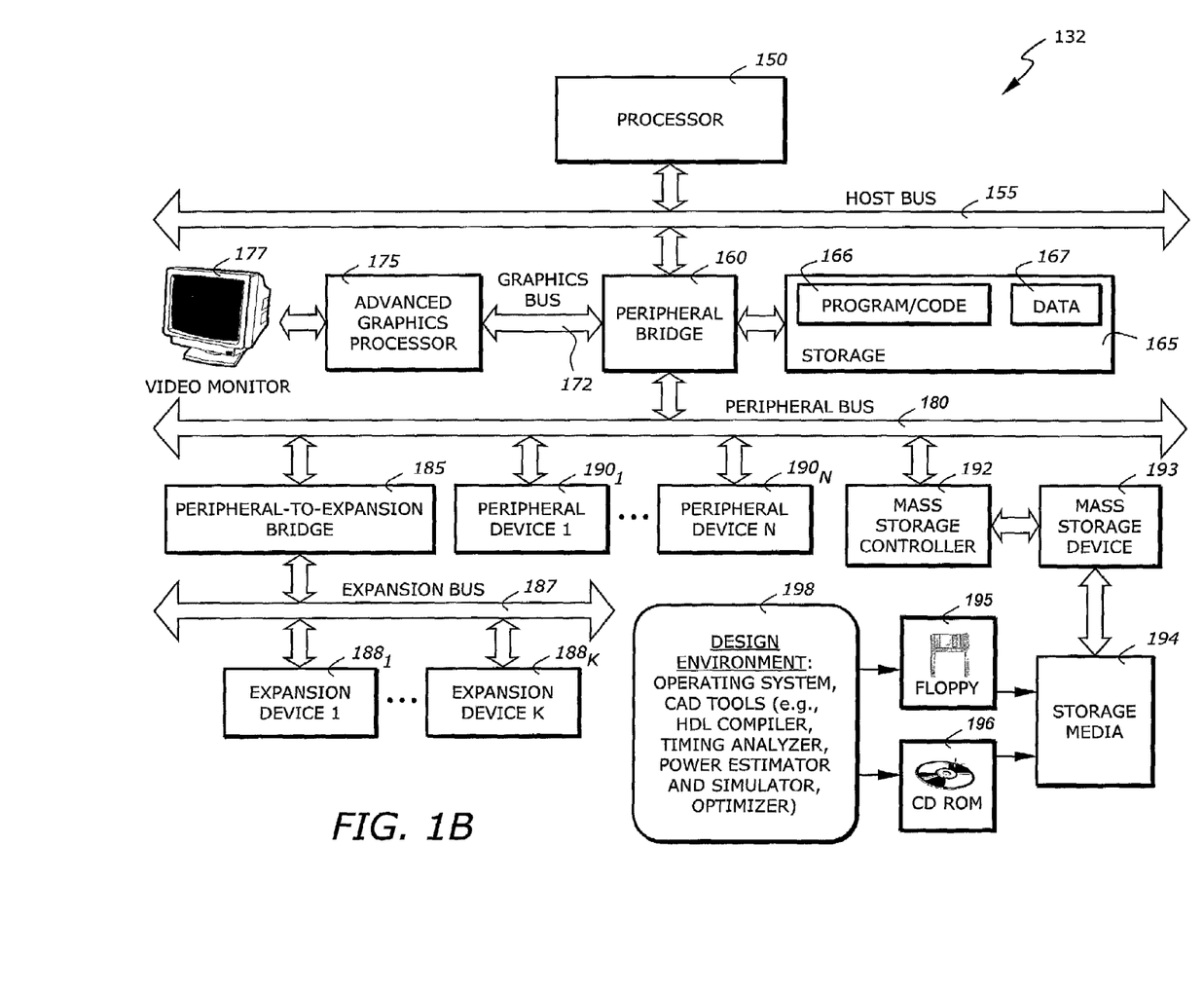
FIG. 1B is a diagram illustrating a computer system in which one embodiment of the present invention may be utilized.

FIG. 1B is a diagram illustrating one embodiment of a computer system 132 in which one embodiment of the present invention may be utilized. The computer system 132 comprises a processor 150, a host bus 155, a peripheral bridge 160, a storage device 165, an advanced graphics processor 175, a video monitor 177, and a peripheral bus 180, The processor 150 represents a central processing unit of any type of architecture, such as complex instruction set computers (CISC), reduced instruction set computers (RISC), very long instruction word (VLIW), or hybrid architecture. The processor 150 is coupled to the peripheral bridge 160 via the host bus 155. While this embodiment is described in relation to a single processor computer system, the invention could be implemented in a multi-processor computer system.

The peripheral bridge 160 provides an interface between the host bus 115 and a peripheral bus 180. In one embodiment, the peripheral bus 180 is the Peripheral Components Interconnect (PCI) bus. The peripheral bridge 160 also provides the graphic port, e.g., Accelerated Graphics Port (AGP), or the graphics bus 172 for connecting to a graphics controller or advanced graphics processor 175. The advanced graphics processor 175 is coupled to a video monitor 177. The video monitor 177 displays graphics and images rendered or processed by the graphics controller 125. The peripheral bridge 160 also provides an interface to the storage device 165.

The storage device 165 represents one or more mechanisms for storing data. For example, the storage device 165 may include non-volatile or volatile memories. Examples of these memories include flash memory, read only memory (ROM), or random access memory (RAM). FIG. 1B also illustrates that the storage device 165 has stored therein data 167 and program code 166. The data 167 stores graphics data and temporary data. Program code 166 represents the necessary code for performing any and/or all of the techniques in the present invention. Of course, the storage device 165 preferably contains additional software (not shown), which is not necessary to understanding the invention.

The peripheral bus 180 represents a bus that allows the processor 150 to communicate with a number of peripheral devices. The peripheral bus 180 provides an interface to a peripheral-to-expansion bridge 185, peripheral devices $190_1$ to $190_N$, a mass storage controller 192, a mass storage device 193, and mass storage media 194. The peripheral devices $190_1$ to $190_N$ represent any device that is interfaced to the peripheral bus 180. Examples of peripheral devices are fax/modem controller, audio card, network controller, etc. The mass storage controller 192 provides control functions to the mass storage device 193. The mass storage device 193 is any device that stores information in a non-volatile manner. Examples of the mass storage device 193 includes hard disk, floppy disk, and compact disk (CD) drive. The mass storage device 193 receives the mass storage media 194 and reads their contents to configure the design environment for the design engineer.

The mass storage media 194 contain programs or software packages used in the environment. The mass storage media 194 represent a computer program product having program code or code segments that are readable by the processor 150. A program code or a code segment includes a program, a routine, a function, a subroutine, or a software module that is written in any computer language (e.g., high level language, assembly language, machine language) that can be read, processed, compiled, assembled, edited, downloaded, transferred, or executed by the processor 150. The mass storage media 194 include any convenient media such as floppy diskettes, compact disk read only memory (CDROM), digital audio tape (DAT), optical laser disc, or communication media (e.g., internet, radio frequency link, fiber optics link). For illustrative purposes, FIG. 1B shows floppy diskettes 195 and compact disk read only memory (CDROM) 196. The floppy diskettes 195 and/or CDROM 196 contain design environment 198. Examples of the tools or computer readable program code in the design environment 198 include operating system, computer aided design (CAD) tools such as schematic capture, hardware description language (HDL) compiler, text editors, netlist generator, timing analyzer, power vector generator, timing simulator, power simulator, circuit configuration, component sizer, parameter function generator, parameter optimizer, and graphics design environment. These tools, together with the operating system of the computer system 132 form the design environment 198 on which the design and optimization process can be carried out.

The peripheral-to-expansion bridge 187 represents an interface device between the peripheral bus 180 and an expansion bus 187. The expansion bus 187 represents a bus that interfaces to a number of expansion devices $188_1$ to $188_K$. Example of an expansion device includes a parallel input/output (I/O) device, a serial communication interface device. In one embodiment, the expansion bus 187 is an Industry Standard Architecture (ISA) or Extended Industry Standard Architecture (EISA) bus.

The computer system 132 can be used in all or part of the phases of the design process. The processor 150 execute instructions in the program 166 to access data 167 and interact with the design environment 198. In particular, the computer system 132 is used in the design optimization phase 130.

Figure 2:
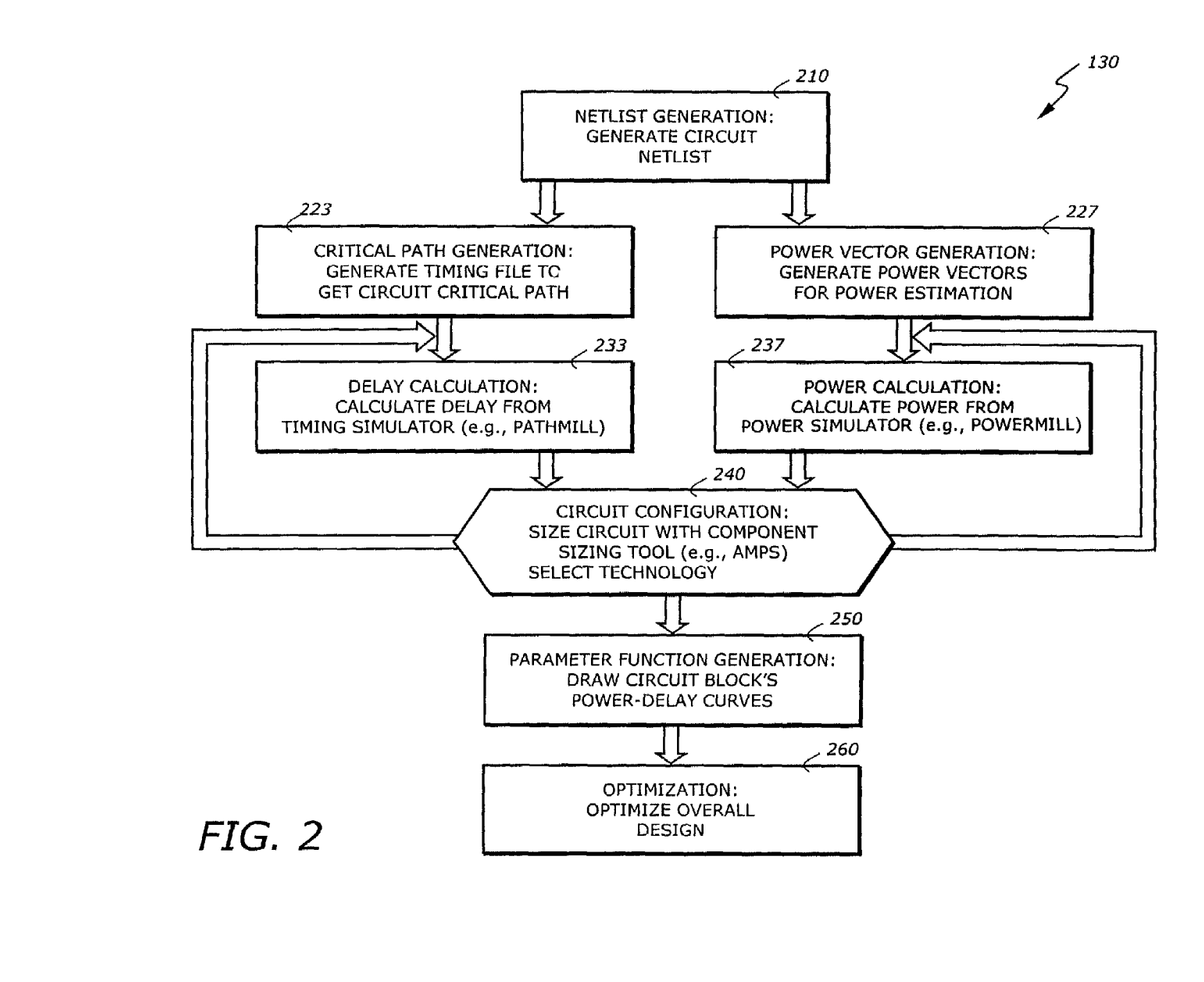
FIG. 2 is a diagram illustrating a design optimization phase according to one embodiment of the invention.

FIG. 2 is a diagram illustrating a design optimization phase according to one embodiment of the invention. The design optimization phase 130 includes a netlist generation module 210, a critical path generation module 223, a power vector generation module 227, a delay calculation module 233, a power calculation module 237, a circuit configuration module 240, a parameter function generation module 250, and an optimization module 260. Each of these modules may be a software module or a hardware module or a combination of both. In one embodiment, these modules are implemented by program code that are readable and executed by the processor 150.

The netlist generation module 210 generates the circuit netlist which provides the information on component identification and how the components of the circuit are interconnected. The circuit netlist becomes the input to the critical path generation module 223 and the power vector generation module 227. The critical path generation module 223 generates timing delays of various paths in the circuit based on circuit components and interconnection patterns. From these timing delays, the critical path(s) is (are) identified. The critical path represents the path through which the overall propagation delay is the most critical, e.g., timing parameters (e.g., setup time, hold time) are difficult to satisfy. The timing files generated by the critical path generation module 223 become the input to the delay calculation module 233. The delay calculation module 233 calculates the delays of the critical paths and other paths using a timing simulator. In one embodiment, the timing simulator is the PathMill tool, developed by Epic Technologies, now owned by Synopsys, of Mountain View, Calif. The timing values are then forwarded to the circuit configuration module 240. On the power side, the power vector generation module 227 generates power vectors as input to the power calculation module 237. The power calculation module 237 calculates the power consumption of the circuit using a power estimator tool. In one embodiment, the power estimator tool is the PowerMill tool, developed by Epic Technologies of Mountain View, Calif. The power values are then forwarded to the circuit configuration module 240.

The circuit configuration module 240 configures the circuit to effectuate the power consumption and delay. One configuration is scaling the sizes (e.g., transistor size) of the circuit components using a sizing tool. In one embodiment, the sizing tool is Amps developed by Epic Technologies of Mountain View, Calif. The sizing tool applies scale factors to scale down the circuit elements either globally or locally. The resulting circuit is then simulated again for the next delay and power values. The circuit configuration module 240 generates new circuit information to be fedback to the delay calculation module 233 and the power calculation module 237. The process continues until all the values within the range of the scaling have been used. Then the delay and power values are forwarded to the parameter function generation module 250. The parameter function generation module 250 generates the parameter function (e.g., power-delay curves) showing the relationship between the design parameters. The parameter function generation module 250 may also generate the design parameters in any other convenient forms for later processing.

The optimization module 260 receives the values of the design parameters either in the form of a parameter curve, or in any other convenient format. The optimization module 260 determines the optimal values of the design parameters.

Figure 3:
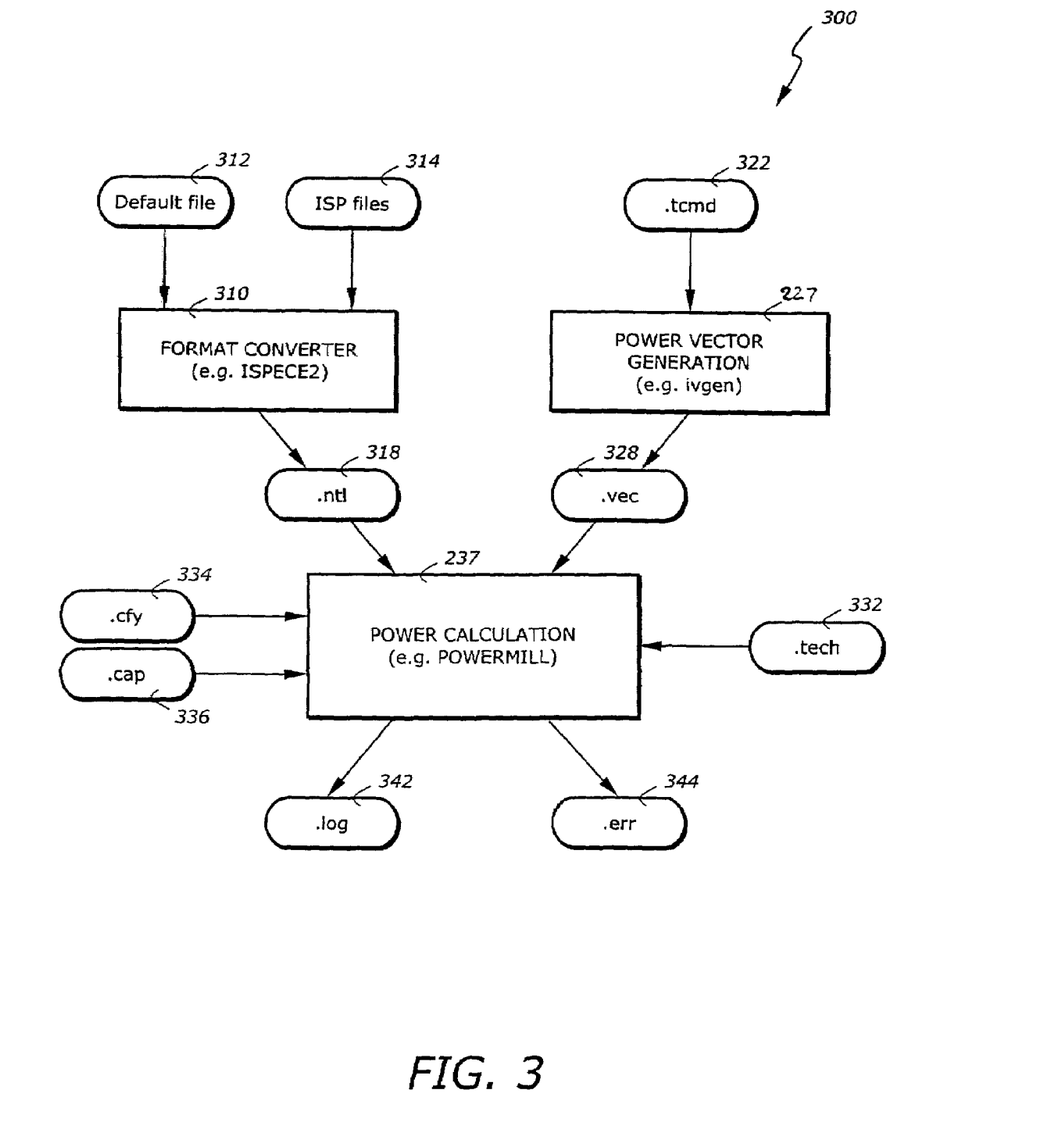
FIG. 3 is a diagram illustrating an environment for the power modules using tools according to one embodiment of the invention.

FIG. 3 is a diagram illustrating an environment for the power modules using tools according to one embodiment of the invention. The environment 300 includes a format converter module 310, the power vector generation module 227, and the power calculation module 237.

The format converter module 310 receives a default file 312 and Intel SPice (ISP) files 314, and generates a netlist file (.ntl) 318. In one embodiment, the format converter module 310 uses a program called ISPECE2 to map interconnect models and assign transistor sizes for transistors. The ISPECE2 program converts a netlist file into another netlist file which has a format compatible with the program used in the power calculation module 237. The default file 312 is used by the ISPECE2 program and provides some default information based on the current circuit technology. The ISP files are circuit description files or netlist files that describe the transistor sizes, cell names, and circuit connectivity for the designs. The .ntl file 318 is a file containing the circuit description and/or netlist file in a format compatible with the power calculation module 237 (e.g., the Epic format which is a format compatible with tools by Epic Technologies).

The power vector generation module 227 receives a command text (.tcmd) file 322 and generates a vector (.vec) file 328. In one embodiment, the power vector generation module uses an Intel Vector Generation (iVGEN) program. The .tcmd file is a small text file which has a list of input pins for a given circuit. The program iVGEN uses the .tcmd file to generate vectors corresponding to the pins listed in the .tcmd file. A script program takes the circuit's ISP file 314 and generate the .tcmd file. The .vect file 328 is the file containing the vectors needed to run the power calculation module 237. The vec file basically contains the time steps and a list of binary values (0's and 1's) for each input in the circuit.

The power calculation module 237 receives the .ntl file 318, the vec file 328, a circuit technology (.tech) file 332, a configuration (.cfg) file 334, and a capacitance (.cap) file 336, and generates a log (.log) file 342 and an error (.err) file 344. In one embodiment, the power calculation module 237 uses a power estimator tool, e.g., PowerMill. The .tech file is a circuit technology dependent file that lists the process parameters for a given circuit technology. This file is used by the PowerMill tool to calculate the current consumption of each transistor in the circuit. The .cfg file 334 is a command file for the PowerMill. The .cfg file 334 is a user generated text file used to instruct the PowerMill what kind of outputs to generate. The command line syntax is according to the PowerMill format. The cap file 336 is a file containing parasitic capacitance from the layout if the layout exists. If the circuit is designed before the layout, there is no cap file 336 and the PowerMill estimates the parasitic capacitance. The .log file 342 contains the output of the power calculation module 237. The .log file 342 contains a list of average and peak current consumption for the entire simulated circuit. The .err file 344 is a file contain errors that may occur during the simulation. Examples of the errors include incomplete input, vectors or syntax problems in the input files.

Figure 4:
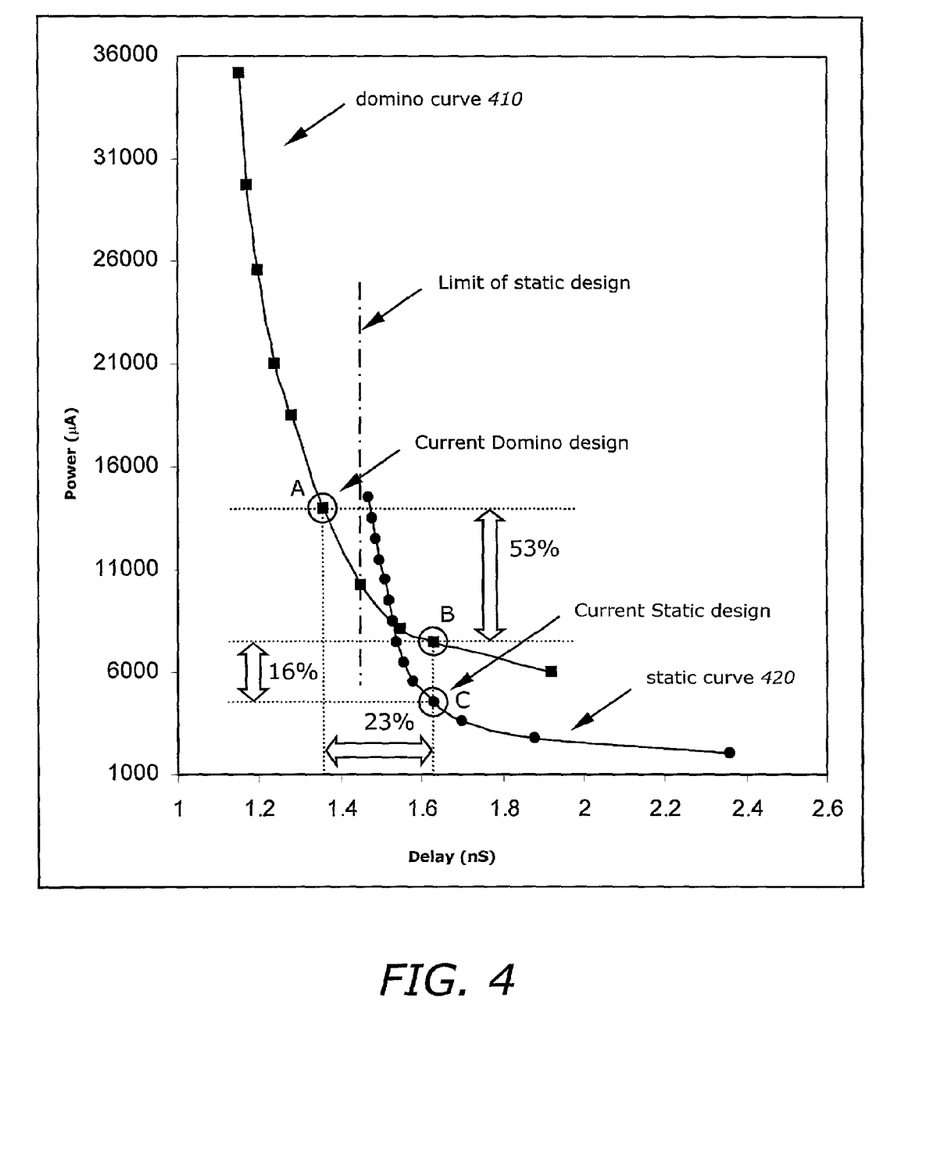
FIG. 4 is a diagram illustrating power-delay curves according to one embodiment of the invention.

FIG. 4 is a diagram illustrating a power-delay curve according to one embodiment of the invention. The power-delay curves show two curves: a domino curve 410 and a static curve 420.

The power-delay curves in FIG. 4 show the parameter function for an arithmetic circuit. The arithmetic circuit can be designed using a domino circuit technology or a static circuit technology. The domino curve 410 is the power-delay curve for the circuit using the domino circuit technology and the static curve 420 is the power-delay curve for the circuit using the static circuit technology.

The domino curve 410 has two design points A and B. The design point A corresponds to the current domino design. At this design point, the circuit has a delay of approximately 1.35 nsec and a power consumption of approximately 14 mA. The design point B corresponds to another domino design with longer delay at approximately 1.62 nsec and a power consumption of approximately 6.1 mA. Therefore the saving in power to go from design point A to design point B is 53% for a delay penalty of 23%.

The static curve 420 has a design point C. The static curve 420 has a delay limit at approximately 1.42 nsec. The design point C is at a delay of approximately 1.62 nsec and a power consumption of approximately 4.5 mA. Therefore, the design point C has approximately the same delay as the design point B of the domino curve 410 but has an additional power saving of 16%.

The parameter curve therefore provide the design engineer an immediate visualization of the relationship between the design parameters, e.g., power, delay, so that optimization can be carried out.

Figure 5:
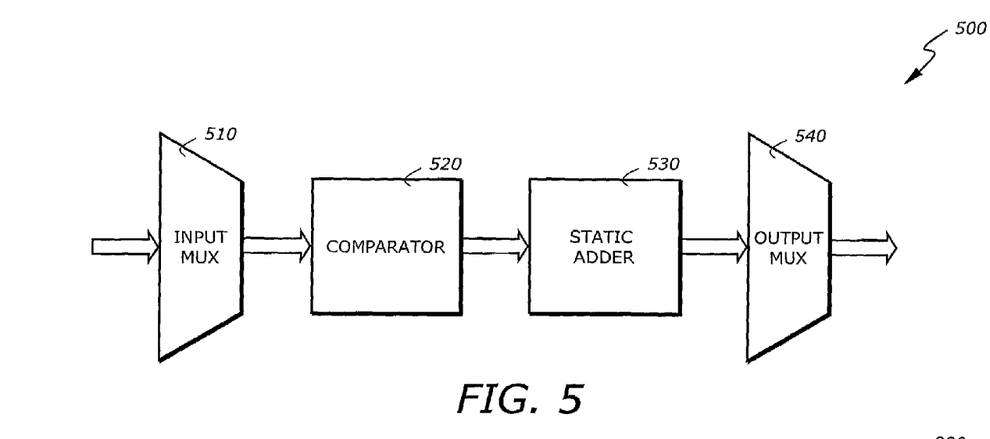
FIG. 5 is a diagram illustrating an example of an arithmetic logic unit datapath functional block according to one embodiment of the invention.

FIG. 5 is a diagram illustrating an example of an arithmetic logic unit (ALU) datapath subsystem or functional block (FB) according to one embodiment of the invention. The ALU datapath FB 500 includes an input multiplexer (MUX) 510, a comparator 520, a static adder 530, and an output MUX 540. The ALU datapath FB 500 is a common design used in the processor 150 or the graphic processor 175 in FIG. 1B.

In this illustrative example, the design parameters include power and delay. The parameter function is the power-delay curve. The constraint parameter is the propagation delay through the ALU FB 500 and the optimizing parameter is the power. The optimization is to minimize the overall power consumption while keeping the propagation delay within the specified design constraint.

The input MUX 510, the comparator 520, the static adder 530 and the output MUX 540 form a cascaded chain of circuit elements which has a critical path going from one end to the other end. The composite delay is the sum of the individual delays through each of the circuit elements. In addition, it is assumed that these circuit elements are active, e.g., the power consumption of the ALU FB 500 is the sum of the individual power consumption.

The design optimization phase includes the generation of the power-delay curves for the individual circuit elements. Then a trade-off analysis is performed on these power-delay curves. Each power-delay curve has several design points. Each design point corresponds to a design configuration of the circuit. In one embodiment, the design configuration is the transistor size characterized by a scale factor. The design optimization phase begins with a set of initial design points on the power-delay curves. These initial design points correspond to a composite delay that meets the specified timing constraint. The optimization process then proceeds to iteratively determine the new set of design points on the power-delay curves such that the specified timing constraint remains met while the total power is reduced.

Figure 6A:
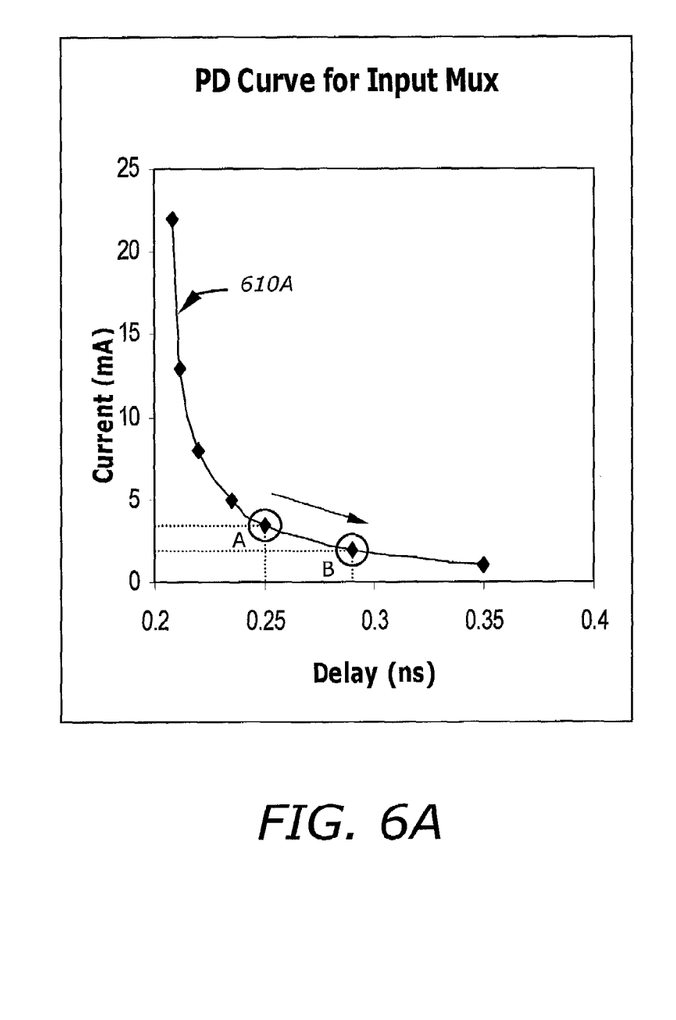
FIG. 6A is a diagram illustrating a power-delay curve for the input multiplexer shown in FIG. 5 according to one embodiment of the invention.

FIG. 6A is a diagram illustrating a power-delay curve 610A for the input multiplexer shown in FIG. 5 according to one embodiment of the invention. The power-delay curve 610A has two design points, A and B. The design point A has a delay value of 0.25 nsec and a power value of 3.2 mA. The design point B has a delay value of 0.28 nsec and a power value of 1.6 mA. A and B are the initial and new design points, respectively. The arrow shows the move from design point A to design point B during the design optimization phase.

Figure 6B:
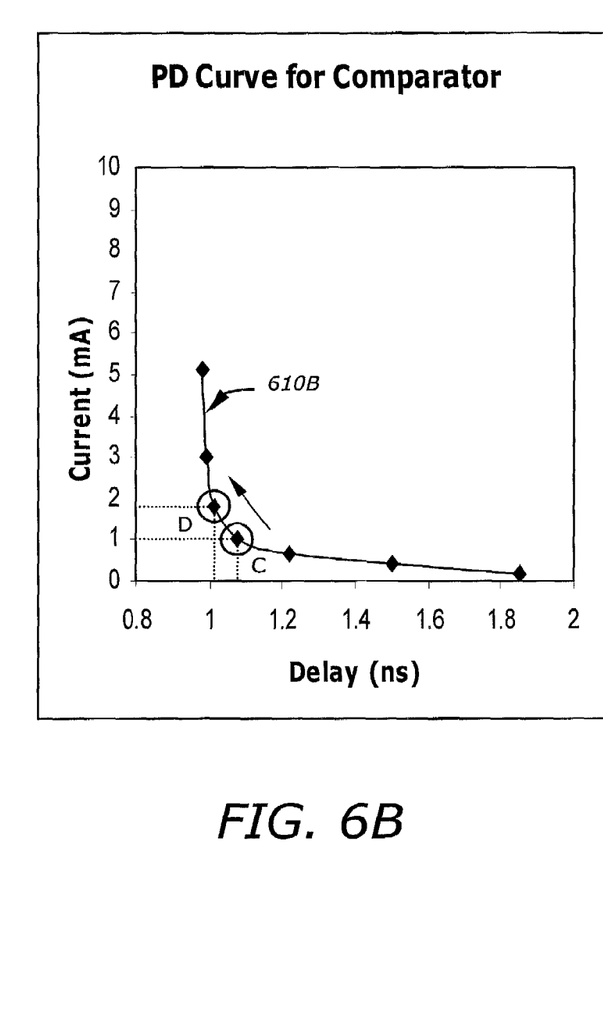
FIG. 6B is a diagram illustrating a power-delay curve for the comparator shown in FIG. 5 according to one embodiment of the invention.

FIG. 6B is a diagram illustrating a power-delay curve 610B for the comparator shown in FIG. 5 according to one embodiment of the invention. The power-delay curve 610B has two design points, C and D. The design point C has a delay value of 1.12 nsec and a power value of 1.0 mA. The design point D has a delay value of 1.05 nsec and a power value of 1.9 mA. C and D are the initial and new design points, respectively. The arrow shows the move from design point C to design point D during the design optimization phase.

Figure 6C:
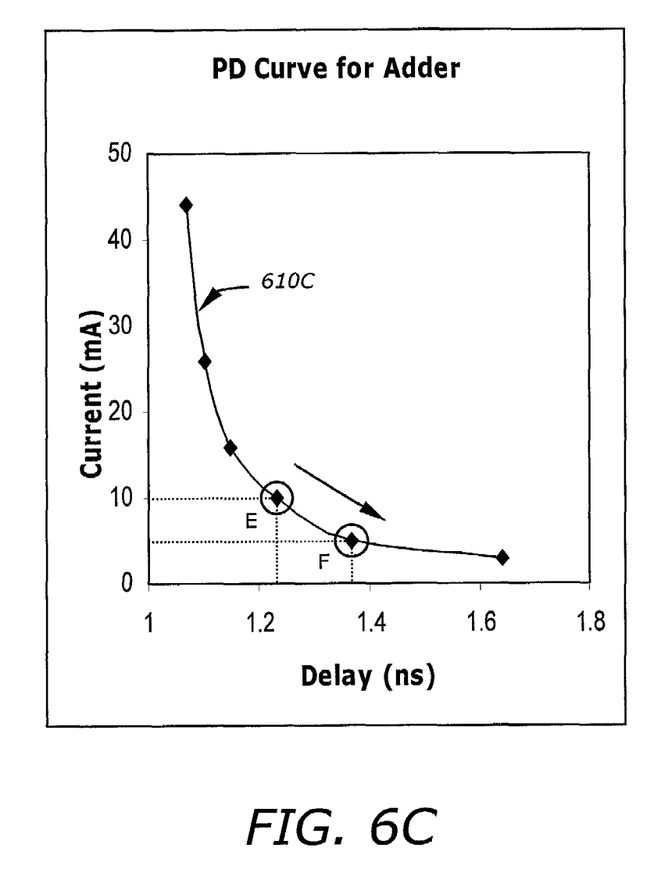
FIG. 6C is a diagram illustrating a power-delay curve for the static adder shown in FIG. 5 according to one embodiment of the invention.

FIG. 6C is a diagram illustrating a power-delay curve 610C for the static adder shown in FIG. 5 according to one embodiment of the invention. The power-delay curve 610C has two design points, E and F. The design point E has a delay value of 1.23 nsec and a power value of 10.0 mA. The design point F has a delay value of 1.37 nsec and a power value of 4.0 mA. E and F are the initial and new design points, respectively. The arrow shows the move from design point E to design point F during the design optimization phase.

Figure 6D:
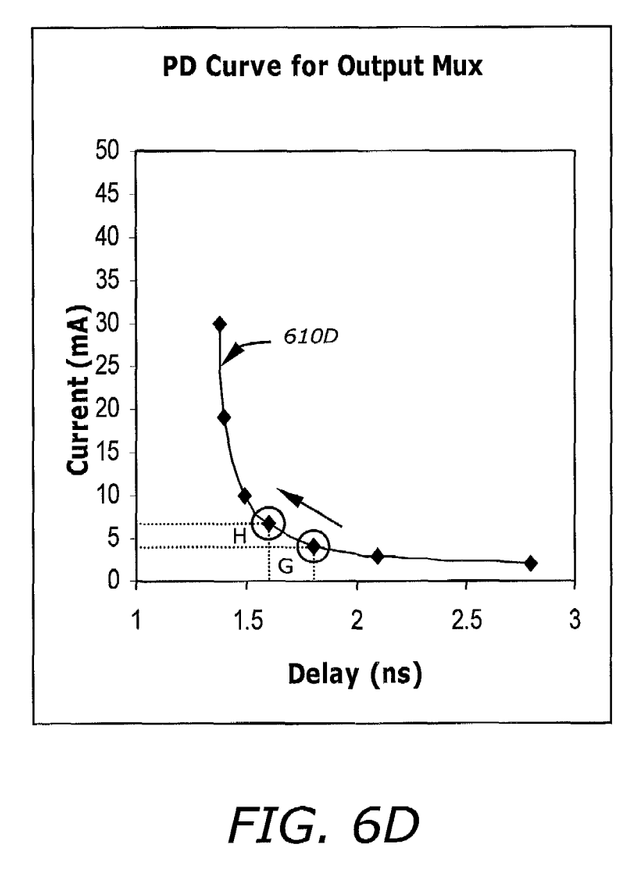
FIG. 6D is a diagram illustrating a power-delay curve for the output multiplexer shown in FIG. 5 according to one embodiment of the invention.

FIG. 6D is a diagram illustrating a power-delay curve for the output multiplexer shown in FIG. 5 according to one embodiment of the invention. The power-delay curve 610D has two design points, G and H. The design point G has a delay value of 1.75 nsec and a power value of 4.0 mA. The design point H has a delay value of 1.65 nsec and a power value of 6.0 mA. G and H are the initial and new design points, respectively. The arrow shows the move from design point G to design point H during the design optimization phase.

The power and delay parameters obtained from the power-delay curves 610A, 610B, 610C, and 610D have the following values:

| Initial design points: | | |
|---|---|---|
| Total delay: | 0.25 + 1.12 + 1.23 + 1.75 = | 4.35 nsec |
| Total current: | 3.2 + 1.0 + 10.0 + 4.0 = | 18.2 mA |
| New design points: | | |
| Total delay: | 0.28 + 1.05 + 1.37 + 1.65 = | 4.35 nsec |
| Total current: | 1.6 + 1.9 + 4.0 + 6.0 = | 13.5 mA |

Therefore, it is seen that the new design points B, D, F, H result in the same composite delay of 4.35 nsec, but with a 25.8% saving in power.

The power-delay curves in FIGS. 6A, 6B, 6C, and 6D illustrate the optimization process by varying the variable design parameter and selecting the best overall values. The variable design parameter is common to all the curves. In this example, the variable design parameter is the transistor size, or the power of the block.

The optimization process can be applied for different circuit configurations. For example, a circuit block can be designed using a static circuit technology or a dynamic (e.g., domino) circuit technology as illustrated in FIG. 4. In another example, a circuit block may be designed using a multiplexer or a decoder. In these cases, the optimization process can be carried out based on the parameter function, e.g., power-delay curve.

Figure 7:
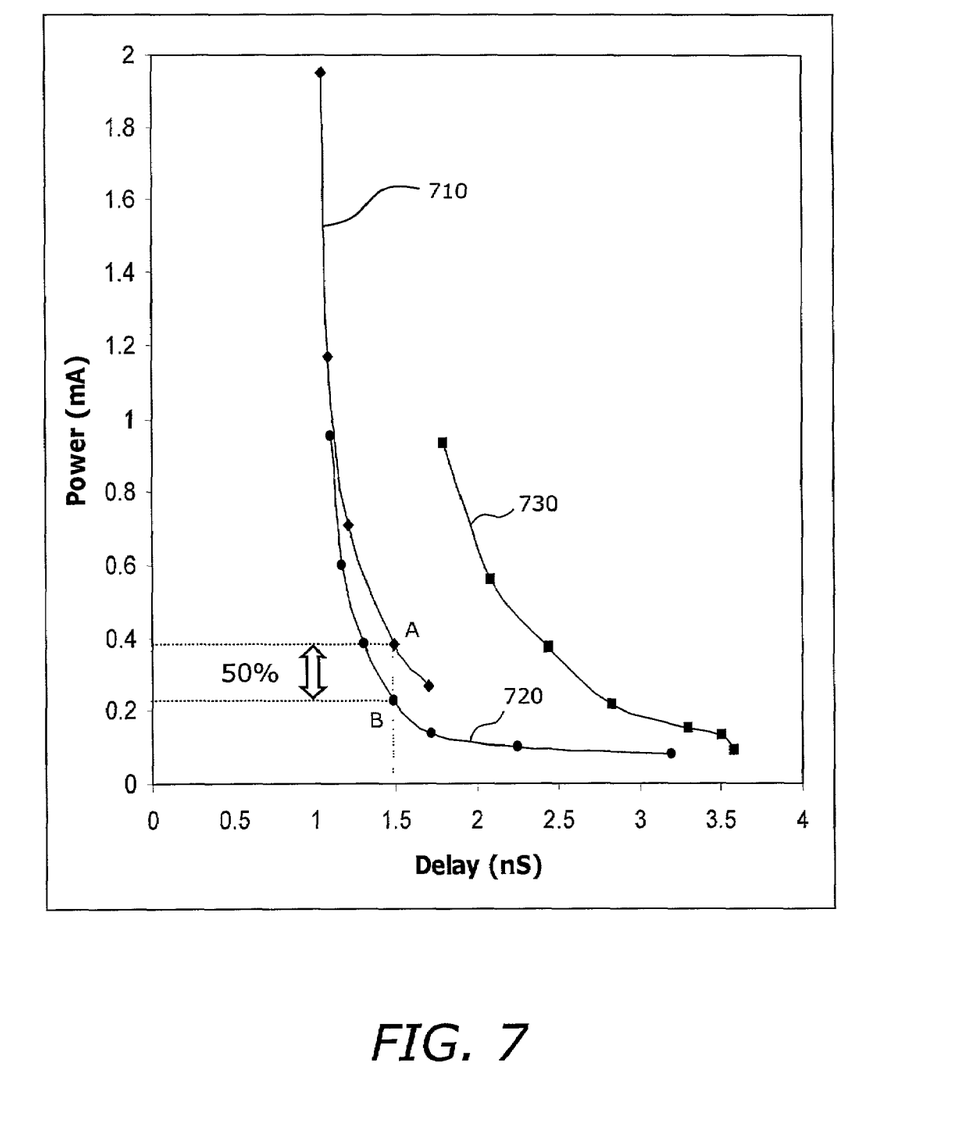
FIG. 7 is a diagram illustrating a comparison of the power-delay curves for the three different implementation of an example circuit according to one embodiment of the invention.

FIG. 7 is a diagram illustrating a comparison of the power-delay curves for the three different implementation of an example circuit according to one embodiment of the invention. The power-delay curve 710, 720, and 730 correspond to the initial, better, and worse designs, respectively.

The power-delay curve 710 has high power consumption but fast speed. The power-delay curve 720 has a wider delay range and reasonable power consumption. The power-delay curve 730 is similar to 720 but the delay covers a slower range.

Suppose the design constraint is a delay of approximately 1.5 nsec. Under this timing constraint, it is seen that the design depicted by the power-delay curve 730 is not acceptable. Both designs depicted by the power-delay curves 710 and 720 are acceptable because they cover the specified timing constraint. However, the power-delay curve 720 shows a better design because at 1.5 nsec, it results in a 50% power reduction.

Figure 8:
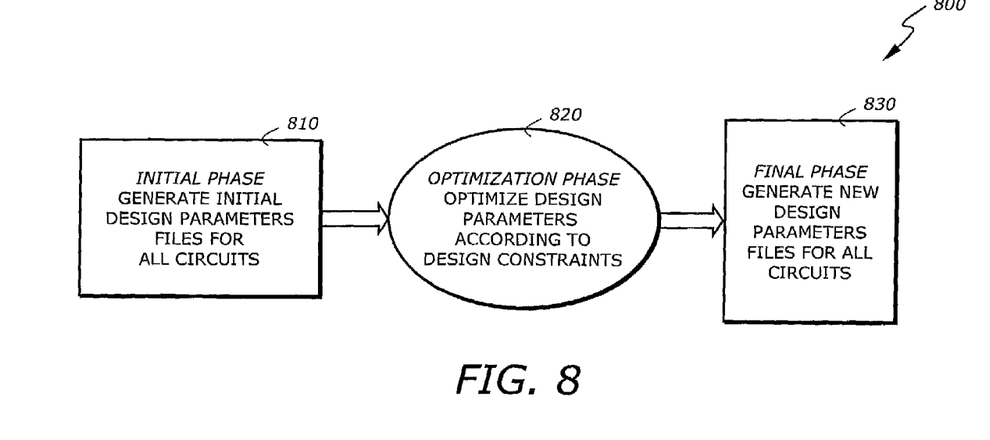
FIG. 8 is a diagram illustrating a design process according to one embodiment of the invention.

FIG. 8 is a diagram illustrating a design process 800 according to one embodiment of the invention. The design process 800 includes an initial phase 810, an optimization phase 820, and a final phase 830.

In the initial phase 810, the design engineer generates the initial design parameters files for all circuits in the circuit block. The initial design parameters are selected according to some predetermined criteria. In most cases, they are selected based on the experience of the design engineer. The selected design parameters may or may not meet the design constraints.

In the optimization phase 820, the design engineer optimizes the optimizing parameters according to the design constraints imposed on the constraint parameters. As part of the optimization phase 820, parameter functions are generated to facilitate the trade-off analysis. In one embodiment, the parameter functions are shown as parameter data files which contain values of the parameters at various design points. The optimization process can be done manually, automatically, or semiautomatically. In manual mode, the design engineer examines the parameter function and adjusts the design points in an iterative manner to improve the optimizing parameter(s) while keeping the constraint parameters to be within the specified range. In automatic mode, an optimization program reads the parameter data files and process the data according to an optimization algorithm. Numerous optimization algorithms for numerical data exist. Examples include traditional search algorithms, branch-and-bound, scheduling techniques, and genetic algorithms. In semiautomatic mode, part of the optimization can be done manually and part is done automatically. The optimization is usually done iteratively. The optimizing parameters are selected to provide overall optimal values while keeping the constraint parameters within the specified design constraints. The iterative process is terminated when the optimal values are within a predetermined range.

The final phase 830 generates the new design parameters files from the values determined by the optimization phase 820. The new design parameters are used for all the circuits in the subsystem or functional block.

The product as a result of the above three phases may include a design environment, a computer program product, a software library, a script file, a program, or a function stored in any computer readable media. The elements of the product includes a code or program segment to create the parameter functions for the circuits, a code or program segment to optimize the design parameters based on the generated parameter functions, a code or program segment to configure each circuit in the subsystem or functional block or subsystem, a code or program segment to generate the values of the design parameters to be used in creating the parameter functions, a code or program segment to select the values of the constraint parameters to meet the design constraints, a code or program segment to determine the values of the optimizing parameters, a code or program segment to iterate the determination and selection of the values of the parameters, a code or program segment to size the circuit components, a code or program segment to select the circuit technology (e.g., domino versus static), and a code or program segment to perform CAD functions (e.g., netlist generation, timing analysis, power vector generation, timing and power calculations). As is known by one skilled in the art, these code or program segments may link, call, or invoke other programs or modules including the CAD tools.

The present invention therefore is a technique to optimize the design of a subsystem or functional block having a number of circuits. The subsystem or functional block has a set of design parameters which are divided into two groups: optimizing parameters and constraint parameters. The technique includes the generation of parameter functions or data files which show the relationship between the design parameters. An optimization process is then carried out to select the optimal values for the optimizing parameters while keeping the constraint parameters to be within the specified range. The technique provides the design engineer a global picture of the overall design so that global optimization can be performed.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method comprising:
   (a) creating parameter functions for a plurality of circuits in a subsystem, the subsystem having design constraints, each one of the parameter functions corresponding to each one of the circuits, the parameter functions representing a relationship among design parameters of the subsystem, the design parameters including constraint and optimizing sets;
   (b) selecting initial design points on the parameter functions having a first sum of the constraint set and a second sum of the optimizing set such that the first sum satisfies the design constraints; and
   (c) selecting new design points on the parameter functions such that the second sum is improved within the design constraints.

2. The method of claim 1 wherein the creating the parameter functions comprises:
   (a1) configuring each circuit of the plurality of circuits; and
   (a2) generating values of design parameters for each circuit according to the configured circuit, the values providing the parameter functions.

3. The method of claim 2 wherein the constraint set includes constraint parameters having values selectable to meet the design constraints and the optimizing set includes optimizing parameters having values to be optimized.

4. The method of claim 3 wherein selecting the new design points comprises:
   (c1) selecting values of the constraint parameters to meet the design constraints;
   (c2) determining values of the optimizing parameters corresponding to the selected values of the constraint parameters based on the parameter functions; and
   (c3) iterating c(1) and (c2) until values of the optimizing parameters are within a predetermined optimal range.

5. The method of claim 3 wherein the constraint parameters include a delay parameter and the optimizing parameters include a power parameter.

6. The method of claim 5 wherein the design constraints include a delay constraint.

7. The method of claim 6 wherein (a1) comprises:
sizing components in each circuit.

8. The method of claim 6 wherein (a1) comprises:
selecting a design technology for each circuit, the design technology being one of static and dynamic technologies.

9. The method of claim 7 wherein (a2) comprises:
   (a21) generating a circuit netlist representing the configured circuit;
   (a22) generating a timing file based on the circuit netlist using a circuit critical path;
   (a23) determining power of the configured circuit based on the circuit netlist;
   (a24) calculating timing values by using a timing simulator; and
   (a25) calculating power values by using a power estimator.

10. The method of claim 9 wherein selecting the new design points comprises:
   (c1selecting values of the delay parameter within the delay constraint;
   (c2) determining values of the power parameter corresponding to the selected values of the delay parameter based on the parameter function; and
   (c3) iterating (c1) and (c2) until values of the power parameter are within a predetermined optimal range.

11. A machine readable medium having embodied thereon a computer program for processing by a machine, the computer program comprising:
   (a) a first code segment to create parameter functions for a plurality of circuits in a subsystem, the subsystem having design constraints, each one of the parameter functions corresponding to each one of the circuits, the parameter functions representing a relationship among design parameters of the subsystem, the design parameters including constraint and optimizing sets;
   (b) a second code segment to select initial design points on the parameter functions having a first sum of the constraint set and a second sum of the optimizing set such that the first sum satisfies the design constraints; and
   (c) a third code segment to select new design points on the parameter functions such that the second sum is improved within the design constraints.

12. The machine readable medium of claim 11 wherein the first code segment comprises:
   (a1) a code segment to configure each circuit of the plurality of circuits; and
   (a2) a code segment to generate values of design parameters for each circuit according to the configured circuit, the values providing the parameter functions.

13. The machine readable medium of claim 12 wherein the constraint set includes constraint parameters having values selectable to meet the design constraints and the optimizing set includes optimizing parameters having values to be optimized.

14. The machine readable medium of claim 13 wherein the third code segment comprises:
(c1) a code segment to select values of the constraint parameters to meet the design constraints;
(c2) a code segment to determine values of the optimizing parameters corresponding to the selected values of the constraint parameters based on the parameter functions; and
(c3) a code segment to iterate (c1) and (c2) until values of the optimizing parameters are within a predetermined optimal range.

15. The machine readable medium of claim 13 wherein the constraint parameters include a delay parameter and the optimizing parameters include a power parameter.

16. The machine readable medium of claim 15 wherein the design constraints include a delay constraint.

17. The machine readable medium of claim 16 wherein (a1) comprises:
a code segment to size components in each circuit.

18. The machine readable medium of claim 16 wherein (a1) comprises:
a code segment to select a design technology for each circuit, the design technology being one of static and dynamic technologies.

19. The machine readable medium of claim 18 wherein (a2) comprises:
(a21) a code segment to generate a circuit netlist representing the configured circuit;
(a22) a code segment to generate a timing file based on the circuit netlist using a circuit critical path;
(a23) a code segment to determine power vectors of the configured circuit based on the circuit netlist;
(a24) a code segment to calculate timing values; and
(a25) a code segment to calculate power values.

20. The machine readable medium of claim 19 wherein the third code segment comprises:
(c1) a code segment to select values of the delay parameter within the delay constraints;
(c2) a code segment to determine values of the power parameter corresponding to the selected values of the delay parameter based on the parameter function; and
(c3) a code segment to iterate (c1) and (c2) until values of the power parameter are within a predetermined optimal range.

21. A system comprising:
a memory for storing program instructions;
a processor coupled to the memory to execute the program instructions, the program instructions when executed by the processor interacting with tools provided by a design environment causing the processor to at least
(a) create parameter functions for a plurality of circuits in a subsystem, the subsystem having design constraints, each one of the parameter functions corresponding to each one of the circuits, the parameter functions representing a relationship among design parameters of the subsystem, the design parameters including constraint and optimizing sets,
(b) select initial design points on the parameter functions having a first sum of the constraint set and a second sum of the optimizing set such that the first sum satisfies the design constraints; and
(c) select new design points on the parameter functions such that the second sum is improved within the design constraints.

22. The system of claim 21 wherein the program instructions causing the processor to create the parameter functions causes the processor to:
(a1) configure each circuit of the plurality of circuits; and
(a2) generate values of design parameters for each circuit according to the configured circuit, the values providing the parameter functions.

23. The system of claim 21 wherein the constraint set includes constraint parameters having values selectable to meet the design constraints and the optimizing set includes optimizing parameters having values to be optimized.

24. The system of claim 23 wherein the program instructions causing the processor to select the new design points causes the processor to:
(c1) select values of the constraint parameters to meet the design constraints;
(c2) determine values of the optimizing parameters corresponding to the selected values of the constraint parameters based on the parameter functions; and
(c3) iterate (c1) and (c2) until values of the optimizing parameters are within a predetermined optimal range.

25. The system of claim 23 wherein the constraint parameters include a delay parameter and the optimizing parameters include a power parameter.

26. The system of claim 25 wherein the design constraints include a delay constraint.

27. A method comprising:
(a) generating first and second parameter functions for a circuit corresponding to first and second technologies, each of the first and second parameter functions relating a constraint parameter and an optimizing parameter;
(b) selecting a first initial design point and a first new design point on the first parameter function such that the first new design point corresponds to a first improved optimizing parameter within a design constraint;
(c) selecting a second initial design point and a second new design point on the second parameter function such that the second new design point corresponds to a second improved optimizing parameter within the design constraint; and
(d) selecting the first technology if the first improved optimizing parameter is better than the second improved optimizing parameter, else selecting the second technology.

28. The method of claim 27 wherein the first technology is a dynamic technology and the second technology is a static technology.

* * * * *